Oct. 26, 1965 L. D. ARMSTRONG ETAL 3,214,654

OHMIC CONTACTS TO III-V SEMICONDUCTIVE COMPOUND BODIES

Filed Feb. 1, 1961

INVENTORS
LORNE D. ARMSTRONG &
EDWARD G. BUCKLEY
BY
W.S. Hill
AGENT

United States Patent Office 3,214,654
Patented Oct. 26, 1965

3,214,654
OHMIC CONTACTS TO III–V SEMICONDUCTIVE COMPOUND BODIES

Lorne D. Armstrong, Somerville, and Edward G. Buckley, Morris Plains, N.J., assignors to Radio Corporation of America, a corporation of Delaware
Filed Feb. 1, 1961, Ser. No. 86,429
6 Claims. (Cl. 317—237)

This invention relates to improved semiconductor devices. More particularly, the invention relates to improved devices utilizing semiconductive materials, and to improved methods of making such devices.

In the art of making semiconductor circuit devices such as diodes and transistors, the semiconductive materials most often used are elemental germanium and silicon. Certain binary crystalline compounds also exhibit useful semiconductive properties. These materials are known as III–V compounds because they are made of one element from the third column and one element from the fifth column of the Periodic Table. Examples of such compounds are the phosphides, arsenides and antimonides of aluminum, gallium and indium. The III–V compounds have some advantages over conventional materials such as germanium and silicon: for example, the mobility of negative charge carriers is usually much greater in most of these compounds than in germanium or silicon. However, it has been found difficult to fabricate satisfactory devices such as diodes and transistors utilizing these compound materials. One of the problems in the manufacture of junction type semiconductor devices from III–V compounds is the difficulty of making good ohmic or non-rectifying contacts on wafers of these materials. The fabrication of good ohmic contacts on wafers of these materials is particularly difficult when it is required that the contacts be capable of high temperature operation.

An object of this invention is to provide improved semiconductive devices utilizing compound semiconductors.

Another object of this invention is to provide improved circuit elements utilizing III–V compounds.

A further object is to provide improved methods of fabricating III–V compound semiconductor devices.

Still another object of this invention is to provide improved ohmic contacts for semiconductive devices made of III–V compounds.

Yet another object of this invention is to provide an improved type of semiconductor device for high temperature operation, having improved non-rectifying electrodes.

These and other objects of the invention are accomplished by depositing a coating of a metal selected from the group consisting of silver, gold, and those elements of column 8 of the Periodic Table having an atomic weight over 100, on at least a portion of the surface of a crystalline semiconductive III–V compound wafer. A layer of a metal selected from the group consisting of cobalt and nickel is then deposited over the coating. According to one embodiment of the invention, the cobalt or nickel layer is formed by electroplating. According to another embodiment of the invention, the cobalt or nickel layer is formed by electroless plating. It has unexpectedly been found that an ohmic contact which is operative at elevated temperatures is thereby fabricated on both P-type and N-type III–V compound wafers.

The invention and its advantages will be described in greater detail with reference to the accompanying drawing, in which.

Similar reference numerals are applied to similar elements throughout the drawing.

The invention will be described in connection with the fabrication of a mesa diode, but it will be understood that this is by way of example only, and not limitation. The method of the invention is equally applicable to other two-terminal semiconductor devices such as variable capacitance diodes, tunnel diodes, PNPN diodes, three-terminal devices such as triode transistors, four-terminal devices such as tetrodes, and generally to all those semiconductor devices which are made of III–V semiconductive materials.

*Example I*

Figures 1, 2, 3, 4, 5:
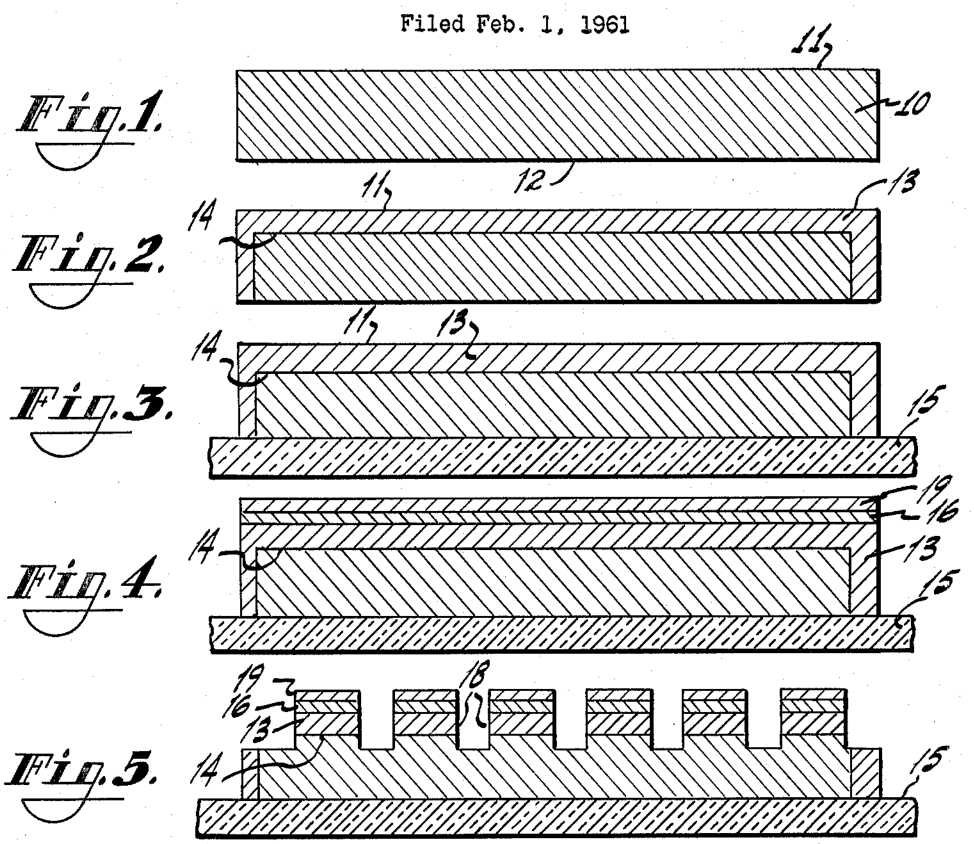
FIGURES 1–5 are schematic longitudinal cross-sectional views of successive steps in the fabrication of a semiconductor device according to the invention.

Referring to FIG. 1, a slice 10 of a semiconductive III–V compound is prepared with two opposing major faces 11 and 12. The exact size and shape of slice 10 is not critical in the practice of the invention. In this example, slice 10 has an area of about 1 $cm.^2$, is about 10 mils thick, and is made of N-type gallium arsenide. Both major faces 11 and 12 are lapped flat, then chemically polished by known techniques.

Next, slice 10 is placed in a quartz furnace boat with one major face, for example face 12, down. An acceptor such as zinc or cadmium is then diffused into slice 10 so as to form a P-type zone 13 immediately beneath the other major face 11, and around the periphery, as shown in FIG. 2. Alternatively, the acceptor utilized may consist of manganese, as described in application S.N. 38,643, filed June 24, 1960, and assigned to the same assignee as that of the instant application. In this example, the time and temperature of the diffusion step is selected so that the P-type zone 13 is about 2 mils thick. Between the diffused P-type zone 13 and the N-type bulk of wafer 10 a rectifying barrier or P–N junction 14 is formed. Face 12 of slice 10 is lapped again to remove any of the acceptor material which may have diffused into face 12.

Major face 11 of slice 10 is now given a finely-roughened or matte surface, for example by "sandblasting" face 11 with a fine abrasive such as pumice suspended in air. Other techniques, such as rubbing with emery paper, may also be utilized to roughen face 11.

Slice 10 is now waxed down on a glass slide 15 with the matte face 11 and the diffused P-type zone 13 uppermost, as shown in FIG. 3. The slice is cleaned by immersing the assemblage of slice 10 and glass slide 15 in a mild detergent, rinsing in deionized water, dipping in 50% hydrochloric acid for 15 seconds to remove any oxide layer on the surface, and rinsing again in deionized water to remove all the hydrochloric acid. The assemblage of slice 10 and glass slide 15 is then moved rapidly to a plating tank, and immersed in the plating bath.

The plating solution utilized is one which will deposit on slice 10 a metal selected from the group consisting of silver, gold, and the Group VIII elements having an atomic weight over 100, that is, the metals ruthenium, rhodium, palladium, osmium, iridium, and platinum. In this example, the plating solution utilized is one which will plate rhodium. A suitable solution for this purpose consists of rhodium sulphate, or of a mixture of rhodium sulphate and rhodium phosphate dissolved in water, and has a concentration of about 2 grams rhodium per liter.

The slice 10 is made the cathode of the bath, and a platium electrode is utilized as the bath anode. With the bath at room temperature, the slice 10 is plated for about 30 to 60 seconds, using a current density of about 0.5 to 1.0 ampere per square inch. A thin coating 16 of rhodium is thereby deposited on face 11 of slice 10 as shown in FIG. 4. The thickness of coating 16 has been exaggerated in the drawing for greater clarity.

The assemblage of slice 10 and glass slide 15 is then rinsed with deionized water, and immersed in a second plating bath. The second bath contains a plating solution suitable for depositing either cobalt or nickel. In this example, a nickel plating solution is utilized. Many different formulations of such plating solutions are known to the art. An aqueous solution consisting of 120 grams nickel sulphate per liter, 15 grams ammonium chloride per liter and 15 grams boric acid per liter has been found satisfactory. The pH of the solution is adjusted to be within the range 5.0 to 5.5 by adding some ammonium hydroxide. The slice 10 is made the cathode of the bath, and a platinum electrode is used as the bath anode. With the bath at room temperature, the slice 10 is plated for about two minutes, using a current density of about 10 milliamperes per $cm.^2$. A thin adherent nickel layer 19 is thereby plated over rhodium coating 16. The thickness of nickel layer 19 has been exaggerated in the drawing for greater clarity. The actual thickness of layer 19 is conveniently about 20 to 30 microinches.

If desired, the nickel layer 19 thus deposited can be sintered by removing slice 10 from slide 15 and heating slice 10 to 650° C. for about 15 minutes in a non-oxidizing atmosphere. The adherence of the nickel layer 19 is thereby increased. A smooth second layer of nickel can then be deposited over the first sintered nickel layer by either electroplating or electroless plating techniques, as described above.

Figure 6:
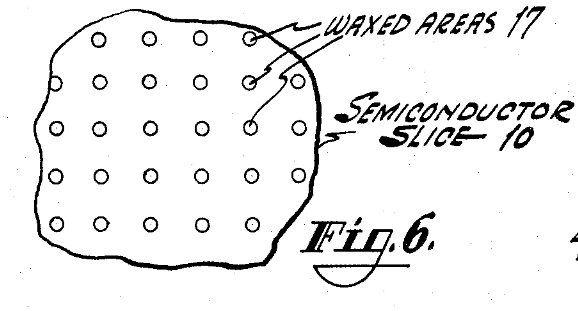
FIGURE 6 is a plan view of a slice of a semiconductive III–V compound during one step in the fabrication of the aforesaid semiconductor device; and, FIGURE 7 is a longitudinal cross-sectional view of the completed semiconductor device.

The assemblage of slice 10 and glass slide 15 is rinsed in deionized water, and some acid resistant material is deposited in a regular pattern on the plated face of slice 10. In this example, some wax is silk-screened on the plated face of slice 10 to form a regular array of waxed areas 17, as shown in FIG. 6. The areas 17 may be circular as in this example, and 5 to 30 mils in diameter, or may be any predetermined suitable shape and size. Other acid-resists may be utilized instead of wax. The assemblage of slice 10 and glass slide 15 is now immersed for about 5 to 10 seconds in an etchant consisting of 80 volumes of concentrated nitric acid, 20 volumes concentrated hydrofluoric acid, and 30 volumes water. This treatment is sufficient to etch through the unprotected portions of layers 19 and 16, and also etch through the P-type region 13. A plurality of mesas 18 is thereby formed on slice 10, as shown in FIG. 5.

The wax layers 17 are now removed from the mesa tops, and slice 10 is detached from glass slide 15, by immersing the assemblage of slice 10 and slide 15 in warm trichloroethylene. The plated face of slice 10 is then scribed by means of a diamond point in a regular grid or checkerboard pattern so as to form an array of squares, which may for example be about 15 to 60 mils on edge. The grid pattern is positioned so that each square contains one mesa. The slice 10 is then broken along the scribed lines into a plurality of semiconductive pellets.

Figure 7:
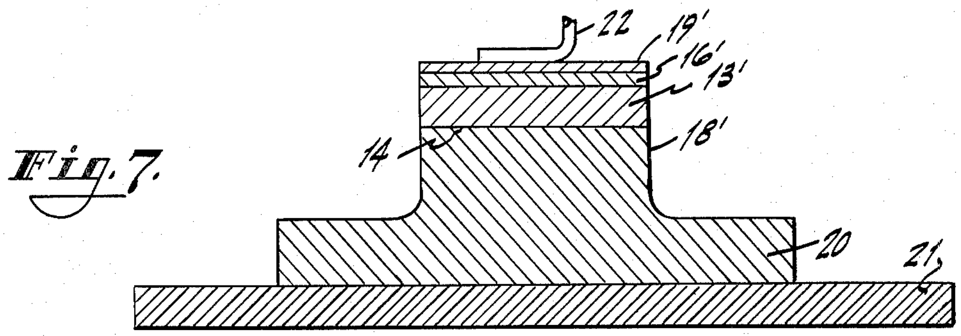

Referring to FIG. 7, each pellet 20' thus fabricated is bonded to a metal supporting plate 21, with the pellet mesa 18' uppermost. The metal support 21 may for example consist of nickel-plated molybdenum, or of nickel-cobalt-iron alloys such as Kovar, Fernico, and the like. A lead wire 22, which may for example be gold, is positioned so that one end of the wire 22 rests on the plated upper surface of mesa 18'. The electrical lead wire 2 is conveniently 1 to 2 mils in diameter. A thermocompression bond between wire 22 and the metal coating 19' is made by pressing a hot metal point (not shown) down on the end of wire 22 so as to bear against the mesa 18'. The temperature of the point is about 500° C. in this example, and the pressure exerted against wire 18' is about 70 grams. Wire 22 thus serves as an electrical lead through nickel layer 19' and rhodium layer 16' to P-type region 13' of the semiconductive pellet 20'. The electrical connection to the P-type region 13' thus formed is non-rectifying or ohmic in character. The device is then encapsulated by methods known to the art.

It has unexpectedly been found that the electrical connection thus fabricated to the mesa 18' remains ohmic at temperatures up to 400° C. Another important advantage of electrical contacts fabricated according to the invention is that the resistance of such contacts remains low (about 1 ohm) at temperatures up to about 400° C.

*Example II*

An ohmic or non-rectifying electrical connection may be made to an indium arsenide mesa diode in a manner similar to that described above in Example I. Instead of utilizing a nickel plating solution for the second plating step, a similar cobalt plating solution may be employed. As a result, the second metal layer 19' on the mesa of the completed device will consist of cobalt. A platinum lead wire 22 is then attached to the cobalt layer 19' by a thermocompression bond, as in Example I. The electrical connection thus made is ohmic in character and resistant to elevated temperatures.

*Example III*

A non-rectifying or ohmic electrical connection may be made to an indium phosphide diode in a manner similar to that described above in Example I. However, after the rhodium coating 16 is plated on semiconductive slice 10, the nickel layer 19 is deposited by electroless plating. This is accomplished by immersing the assemblage of the rhodium-plated indium phosphide slice 10 and the glass slide 15 in an aqueous solution consisting of

| | Grams per liter |
|---|---|
| Nickel chloride ($NiCl_2 \cdot 6H_2O$) | 30 |
| Ammonium chloride ($NH_4Cl$) | 50 |
| Sodium citrate ($Na_3C_6H_6O_7 \cdot 2H_2O$) | 100 |
| Sodium hypophosphite ($Na_2H_2PO_2 \cdot H_2O$) | 10 |

The pH of the resulting solution is adjusted to be within the range 8.0 to 10.0 by adding ammonium hydroxide. After the nickel layer 19 is thus deposited over the rhodium coating 16 on one major face of an indium phosphide slice, the remaining steps in the fabrication of a mesa diode are similar to that described in Example I.

*Example IV*

An ohmic electrical connection may be made to an indium antimonide mesa diode in a manner similar to that described in Example III, but instead of utilizing a nickel electroless plating solution, a cobalt electroless plating solution is employed. The cobalt electroless plating solution is similar to that utilized in Example II, but contains cobalt chloride instead of nickel chloride. The other steps in the fabrication of the device are similar to those described above in Example III.

*Example V*

In the fabrication of an ohmic contact to a semiconductor III–V compound body in accordance with this invention, the coating of silver, gold, ruthenium, rhodium, palladium, osmium, iridium and platinum which is deposited on the III–V body may be formed either by electroplating, or by other methods, such as electroless plating, vacuum evaporation, and "dip" or immersion plating. The embodiment of the invention now described utilized immersion plating.

In this example, a gallium arsenide body 10 is cleaned in a mild detergent, rinsed in deionized water, dipped in 50% hydrochloric acid for fifteen seconds, and rinsed again in deionized water to remove all the hydrochloric acid. The slice 10 is now immersed for one minute in a solution consisting of 3 ml. of 5% palladium chloride ($PdCl_2$) and 20 ml. of concentrated hydrochloric acid per liter of water. The solution is preferably maintained at 80° C. during this step. A thin coating of palladium is thereby deposited on the exposed surface of the gallium arsenide slice. The remaining steps in the fabrication of the mesa diode, including electroplating a layer of nickel over the palladium coating, forming a plurality of mesas on the slice, dicing the slice into a plurality of mesa units, and making a thermocompression bond to the top of each mesa, are similar to those described in Example I above.

*Example VI*

An ohmic contact may be fabricated to a semiconductive III-V compound body in a manner similar to that described in Example II, including cleaning an indium arsenide slice in a detergent, rinsing the slice in deionized water, washing the slice in 50% hydrochloric acid, rinsing the slice again in deionized water, and immersing the slice in a palladium chloride-hydrochloric acid solution to form a thin coating of palladium over the slice. Thereafter the slice is made the cathode of a plating bath, and a layer of cobalt is plated over the palladium, as described in Example II. The subsequent steps of forming a plurality of mesa units, and attaching a gold wire to each mesa by means of a thermocompression bond, are similar to that described above in Example II.

*Example VII*

An ohmic contact suitable for operation at elevated temperatures may be fabricated on a semiconductive III–V compound body in a manner analogous to that described in Example III. In this embodiment, an indium phosphide slice is cleaned in a detergent, rinsed in deionized water, washed in 50% hydrochloric acid, rinsed again in deionized water, and next immersed in a palladium chloride-hydrochloric acid solution to form a thin coating of palladium over the slice. Thereafter the slice is immersed in an electroless nickel plating solution such as an aqueous solution of nickel chloride, ammonium chloride, sodium citrate and sodium hypophosphite so as to form a layer of nickel over the palladium. Subsequent processing steps, including forming a plurality of mesas on the indium phosphide slice, dicing the slice into a plurality of pellets, and forming an electrical connection to the top of each mesa by means of a fine gold wire, are similar to those described in Example III above.

*Example VIII*

An ohmic contact to a semiconductive indium antimonide body may be prepared in a manner somewhat similar to that described in Example IV above. The indium antimonide slice is cleaned in a detergent, rinsed in deionized water, washed in 50% hydrochloric acid, rinsed again in deionized water, and next immersed in a palladium over the slice. The slice is then treated in an electroless plating solution consisting of cobalt chloride, ammonium chloride, sodium citrate and sodium hypophosphite. A layer of cobalt is thereby deposited over the palladium. Subsequent processing steps, including the formation of a plurality of mesas on the slice, dicing the slice into a plurality of pellets, and forming an electrical connection to the mesa on each pellet by means of a thermocompression bond with a fine gold wire, are similar to those described in Example IV above.

The electroplating methods described above are best for coating P-type semiconductive III–V bodies, while the electroless plating and the immersion or dip-plating techniques may be used with either P-type or N-type bodies. Another advantage of the method of the invention is that ohmic contacts thus fabricated are resistant to the etchants, such as potassium hydroxide, which are generally utilized to clean up the semiconductive III–V units prior to encapsulating and casing them.

There have thus been described improved semiconductor devices, and improved methods of fabricating them.

What is claimed is:

1. A semiconductor device comprising a body of a crystalline compound selected from the group consisting of the phosphides, arsenides and antimonides of aluminum, gallium and indium, said body having on at least a portion of the surface thereof an undoped coating of a metal selected from the group consisting of silver, gold, ruthenium, rhodium, palladium, osmium, iridium and platinum, a layer of a metal selected from the group consisting of cobalt and nickel over said coating, and an electrical connection to said layer, said connection consisting of a wire of a material selected from the group consisting of gold and platinum bonded to said layer on said body.

2. A semiconductor device comprising a body of a crystalline compound selected from the group consisting of the phosphides, arsenides and antimonides of aluminum, gallium and indium, said body having on at least a portion of the surface thereof an undoped coating of a metal selected from the group consisting of silver, gold, ruthenium, rhodium, palladium, osmium, iridium and platinum, a layer of nickel over said coating, and an electrical connection to said layer, said connection consisting of a wire of a material selected from the group consisting of gold and platinum bonded to said layer on said body.

3. A semiconductor device comprising a body of crystalline gallium arsenide, said body having on at least a portion of the surface thereof an undoped coating of rhodium, a layer of nickel over said coating, and an electrical connection to said layer, said connection consisting of a wire of a material selected from the group consisting of gold and platinum bonded to said layer on said body.

4. A semiconductor device comprising a body of a crystalline compound selected from the group consisting of the phosphides, arsenides and antimonides of aluminum, gallium and indium, and an ohmic connection to said body, said connection comprising and undoped coating on at least a portion of the body surface of a metal selected from the group consisting of silver, gold, ruthenium, rhodium, palladium, osmium, iridium, and platinum, and a layer of a metal selected from the group consisting of cobalt and nickel over said coating.

5. A semiconductor device comprising a body of a crystalline compound selected from the group consisting of the phosphides, arsenides and antimonides of aluminum, gallium and indium and an ohmic connection to said body, said connection comprising an undoped coating of a metal selected from the group consisting of silver, gold, ruthenium, rhodium, palladium, osmium, iridium and platisenides and antimonides of aluminum, gallium and innum on at least a portion of the body surface, a layer of nickel over said coating, and a lead wire of a materal selected from the group consisting of gold and platinum thermo-compression bonded to said nickel layer on said body.

6. A semiconductor device comprising a body of crystalline gallium arsenide and an ohmic connection to said body, said connection comprising an undoped coating of gold on at least a portion of the body surface, a layer of nickel over said coating, and a gold wire thermo-compression bonded to said nickel layer on said body.

(References on following page)

References Cited by the Examiner

UNITED STATES PATENTS

| | | | |
|---|---|---|---|
| 2,813,326 | 11/57 | Liebowitz | 29—25.3 |
| 2,836,878 | 6/58 | Shepard | 29—25.3 |
| 2,877,396 | 3/59 | Armstrong et al. | 317—235 |
| 2,931,958 | 4/60 | Arthur et al. | 317—234 |
| 2,937,324 | 5/60 | Kroko | 317—234 |
| 2,957,112 | 10/60 | Sils | 317—234 |
| 2,963,390 | 12/60 | Dickson | 317—235 |
| 3,012,175 | 12/61 | Jones et al. | 317—235 X |
| 3,093,882 | 6/63 | Emeis | 148—33.6 X |
| 3,114,088 | 6/63 | Abercrombie | 317—237 |

OTHER REFERENCES

Soldering Manual, American Welding Society, 1959, pages 109–112 and 143.

Welker: Zeitschrift für Naturforschung, Periodical for Research in the Natural Sciences, vol. 7a, November 1952, pages 744–749.

JOHN W. HUCKERT, *Primary Examiner.*

SAMUEL BERNSTEIN, JAMES D. KALLAM, DAVID J. GALVIN, *Examiners.*